(12) United States Patent
Yoon

(10) Patent No.: US 12,733,353 B2
(45) Date of Patent: Sep. 8, 2026

(54) ELECTROLUMINESCENCE DISPLAY HAVING MOISTURE-BLOCKING TRENCH

(71) Applicant: LG Display Co., Ltd., Seoul (KR)

(72) Inventor: Kyuhan Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 543 days.

(21) Appl. No.: 18/189,083

(22) Filed: Mar. 23, 2023

(65) Prior Publication Data

US 2024/0023385 A1 Jan. 18, 2024

(30) Foreign Application Priority Data

Jul. 13, 2022 (KR) ........................ 10-2022-0086356

(51) Int. Cl.
*H10K 59/131* (2023.01)
*H10K 59/122* (2023.01)
*H10K 59/124* (2023.01)

(52) U.S. Cl.
CPC ......... *H10K 59/124* (2023.02); *H10K 59/122* (2023.02); *H10K 59/1315* (2023.02)

(58) Field of Classification Search
None
See application file for complete search history.

(56) References Cited

U.S. PATENT DOCUMENTS 10,367,046 B2 7/2019 Lee et al.
2013/0056784 A1* 3/2013 Lee .................... H10K 59/1315 438/22
2015/0144922 A1 5/2015 Moon et al.
2017/0133620 A1 5/2017 Lee et al.
2018/0122882 A1 5/2018 Lee et al.
2020/0013843 A1* 1/2020 Choi .................. H10K 59/1213
2020/0150847 A1 5/2020 Jang et al.
2020/0243637 A1 7/2020 Lee et al.
(Continued)

FOREIGN PATENT DOCUMENTS

CN 104681589 A 6/2015
CN 111613644 A 9/2020
(Continued)

OTHER PUBLICATIONS

Ministry of Intellectual Property of Korea, Office Action, Korean Patent Application No. 10-2022-0086356, Dec. 19, 2025, 12 pages.

*Primary Examiner* — Sue A Purvis
*Assistant Examiner* — Seyon Ali-Simah Punchbeddell
(74) *Attorney, Agent, or Firm* — Fenwick & West LLP

(57) ABSTRACT

An electroluminescence display according to the present disclosure comprises: a substrate including a display area and a non-display area, the non-display area disposed around the display area; a planarization layer on the display area and the non-display area; a bank disposed in the display area and the non-display area on the planarization layer; a cathode electrode disposed in the display area and the non-display area on the bank; a trench disposed in the non-display area as surrounding the display area; and a common power line surrounding the display area at the outside of the trench, and connected to the cathode electrode. The trench has a recessed shape exposing an upper portion of a thin film layer disposed under the planarization layer.

17 Claims, 10 Drawing Sheets

(56) References Cited

U.S. PATENT DOCUMENTS

| | | | | |
|---|---|---|---|---|
| 2020/0273940 | A1* | 8/2020 | Byun .................. | G09G 3/3233 |
| 2021/0193954 | A1 | 6/2021 | Shin | |

FOREIGN PATENT DOCUMENTS

| | | | |
|---|---|---|---|
| CN | 111933663 | A | 11/2020 |
| KR | 10-0722103 | B1 | 5/2007 |
| KR | 10-2013-0025806 | A | 3/2013 |
| KR | 10-2016-0064373 | A | 6/2016 |
| KR | 10-2018-0047589 | A | 5/2018 |
| KR | 10-2020-0004475 | A | 1/2020 |
| KR | 10-2020-0053911 | A | 5/2020 |
| KR | 10-2020-0094264 | A | 8/2020 |
| KR | 10-2021-0079615 | A | 6/2021 |
| KR | 10-2024-0009189 | A | 1/2024 |

* cited by examiner

FIG. 1

NDA
AA
NDA
DM
200
110
II'
VSS
CAT
VDS
300
Y
Z
X
430
450
410
P
I' II
I
500
VDP
TR
CPP
NDA
AA
NDA

NDA
AA
ENC
PA2 PCL PA1
DM
CPH
110
VST
VSS
VTH
CAT
200
TR
TR2
PT(VSS)
MT
TR1
BA
II'
II
I
EA
PH
GI
PL
OLE
CAT EL ANO
DD
DG
DA
DS
DT
SD
SG
SA
SS
ST
DL

DM
CPH
110
VST
VSS
ENC
PA2 PCL PA1
CAT
VTH
200
H2
TR
TR2 TR1
M2
ML
MT
M1
H1
BA CAT
BA
II
II'
I
I'
PAS
GI
PH
PL
OLE
CAT EL ANO
DD
DG
DT
DA
DS
SD
SG
ST
SA
SS
DL

DM
110
200
VSS
CAT
VDS
300
Y
Z
X
II'
II
I'
I
VDD
P
DL
IVS
IVS
IVS
IVS
IVS
TR
NDA
AA
NDA
NDA
AA
NDA
430
450
410
500
VDP
CPP

DM
CPH
VST
VSS
BUF
II'
ENC
PA2 PCL PA1
CAT
VTH
200
LS
H2
M2
TR
PT(VSS)
ML
MT
H1
M1
BA
II
I
PAS
IVS
GI
PL
LS
OLE
CAT EL ANO
DD
DG
DA
DS
DT
SD
SG
SA
SS
ST
DL
BA
I

ELECTROLUMINESCENCE DISPLAY HAVING MOISTURE-BLOCKING TRENCH

CROSS-REFERENCE TO RELATED APPLICATIONS

This application claims the benefit of the Korean Patent Application No. 10-2022-0086356 filed on Jul. 13, 2022, which is hereby incorporated by reference as if fully set forth herein.

BACKGROUND

Field of the Invention

The present disclosure relates to an electroluminescence display. In particular, the present disclosure relates to an electroluminescence display having a trench for blocking the intruding or permeation of the moisture from outer environment.

Background

Among the display apparatuses, the electroluminescence display is a self-luminous type and has excellent viewing angles and contrast ratios, and has advantages such as light weight and thin thickness. Further, as it does not require any additional backlight unit, it has advantageous for the power consumption. In particular, among the electroluminescence display, the organic light emitting display device may be driven at a low DC voltage, has a fast response speed, and has the advantages of low manufacturing cost.

The electroluminescence display may include a plurality of light emitting diodes. The light emitting diode may include an anode electrode, an emission layer on the anode electrode, and a cathode electrode on the emission layer. When a high potential voltage is applied to the anode electrode and a low potential voltage is applied to the cathode electrode, holes from the anode electrode and electrons from the cathode electrode move to the emission layer, respectively. As holes and electrons are combined in the emission layer, excitons are formed in an excitation process, and light is generated due to energy from the excitons. An electroluminescence display provides an image by electrically controlling the brightness of light from the emission layer of a plurality of the light emitting diodes individually divided by banks.

An encapsulation layer may be required to protect various elements included in the electroluminescence display from external foreign materials and moisture. The encapsulation layer is a structural element for covering the upper surface of the substrate on which the light emitting diode is formed, and prevents the penetration of foreign materials from the outer environment. However, layers made of organic materials may be disposed below the light emitting diode layer covered by the encapsulation layer. For example, the bank or the planarization layer may be the organic material layer. When foreign material such as moisture penetrates from the side of the organic layer, the moisture may propagate along the organic layer to the inside where the light emitting diode is formed. Therefore, it is necessary to improve the structure so that moisture penetrating from the outside may not affect the elements disposed inside.

SUMMARY

The purpose of the present disclosure, as for solving the problems described above, is to provide an electroluminescence display having a trench for preventing foreign materials such as moisture penetrating from the outside from being propagated into the display element through an organic layer.

In order to accomplish the above mentioned purposes of the present disclosure, an electroluminescence display according to the present disclosure comprises: a substrate including a display area and a non-display area, the non-display area disposed around the display area; a planarization layer on the display area and the non-display area; a bank disposed in the display area and the non-display area on the planarization layer; a cathode electrode disposed in the display area and the non-display area on the bank; a trench disposed in the non-display area as surrounding the display area; and a common power line surrounding the display area at the outside of the trench, and connected to the cathode electrode. The trench has a recessed shape exposing an upper portion of a thin film layer disposed under the planarization layer.

In an example embodiment, the electroluminescence display further comprises: a passivation layer disposed at the display area and the non-display area, and contacting the bottom surface of the planarization layer.

In an example embodiment, the electroluminescence display further comprises: a metal protection layer overlapping the trench under the planarization layer, and including a same material with the common power line.

In an example embodiment, the electroluminescence display further comprises: a connection pattern disposed between the planarization layer and the bank where the trench is disposed, and electrically connected to the common power line. The connection pattern includes: a first plane part disposed at an upper surface of the planarization layer at a first side of the trench closed to the display area; a second plane part disposed at the upper surface of the planarization layer at a second side of the trench closed to an outer side of the substrate; and a connection part connecting the first plane part and the second plane part and disposed at an inner sidewall of the trench.

In an example embodiment, the cathode electrode is electrically connected to the connection pattern exposed from the trench.

In an example embodiment, the bank includes: a first contact hole exposing some of the first plane part; and a second contact hole exposing some of the second plane part. The cathode electrode is connected to the first plane part via the first contact hole and to the second plane part via the second contact hole, excepting the connection part exposed from the trench.

In an example embodiment, the electroluminescence display further comprises: a common line terminal disposed on the planarization layer in the non-display area, and connecting to the common power line via a common contact hole exposing some portions of the common power line. The cathode electrode is connected to the common line terminal via a common pad contact hole formed at the bank.

In an example embodiment, the electroluminescence display further comprises: a thin film transistor formed in the display area of the substrate; an anode electrode formed in the display area on the planarization layer; and an emission layer on the anode electrode and the bank in the display area.

In addition, an electroluminescence display according to the present disclosure comprises: a substrate; an inorganic layer on the substrate; a first organic layer on the inorganic layer; a first trench formed at the first organic layer; a connection pattern covering the first trench on the first organic layer; a second organic layer on the first organic layer and the connection pattern; a second trench formed at the second organic layer and exposing the connection pattern; a first contact hole exposing a first portion of the connection pattern at one side of the second trench at the second organic layer; a second contact hole exposing a second portion of the connection pattern at another side of the second trench at the second organic layer; and a cathode electrode connected to the first portion of the connection pattern via the first contact hole, and to the second portion of the connection pattern via the second contact hole, so as to be disconnected at the second trench.

In an example embodiment, the first trench and the second trench are overlapped with each other in vertical direction of the substrate.

In an example embodiment, the electroluminescence display further comprises: a common power line disposed under the first organic layer at an outside of the second portion. the cathode electrode is electrically connected to the common power line.

In an example embodiment, the substrate includes a display area and a non-display area, the non-display area surrounding the display area. The first trench and the second trench are disposed in the non-display area as being closed to the display area.

In an example embodiment, the first trench and the second trench have a closed loop shape surrounding the display area. The first contact hole has a closed loop shape surrounding the display area, and disposed between the display area and the first and the second trenches. The second contact hole has a closed loop shape surrounding the first and the second trenches at an outside of the first and second trenches.

In an example embodiment, the display area includes a plurality of pixels. Each pixel includes a driving element and an light emitting element connected to the driving element. The light emitting element includes: an anode electrode on the first organic layer; an emission layer on the anode electrode; and a cathode electrode on the emission layer.

In an example embodiment, the inorganic layer includes a silicon nitride material.

In an example embodiment, the inorganic layer includes a same material as a common power line disposed under the first organic layer at an outside of the second portion.

In an example embodiment, the electroluminescence display further comprises: a buffer layer under the inorganic layer; and a conductive layer formed on the substrate under the buffer layer. The connection pattern is connected to the conductive layer.

In addition, an electroluminescence display according to the present disclosure comprises: a substrate; an inorganic layer on the substrate; a first organic layer on the inorganic layer; a first trench formed at the first organic layer; a connection pattern covering the first trench on the first organic layer; a second organic layer on the first organic layer and the connection pattern; a second trench formed at the second organic layer and exposing the connection pattern; and a cathode electrode connected to the connection pattern.

In an example embodiment, the electroluminescence display further comprises: a metal protection layer overlapping the first and second trenches under the first organic layer.

The electroluminescent display according to the present disclosure may have a trench surrounding the display area and formed by removing a portion of organic layer corresponding to predetermined width. Therefore, the propagation path for a foreign material to penetrate into the organic layer from the sidewall may be cut off. Elements formed in the display area may be protected from being damaged by the foreign materials such as moisture. As the result, the present disclosure may provide a display protecting the light emitting elements and the driving elements, so as to maintain the performance for a long period of time with high quality of display.

In addition to the effects of the present disclosure mentioned above, other features and advantages of the present disclosure will be clearly understood by those of ordinary skilled persons in the art to which the present disclosure belongs, from what is described below or from such descriptions.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 1 is a plane view illustrating a plane view of an electroluminescence display according to the present disclosure.

FIG. 5 is a cross-sectional view along the cutting line I-I' and II-II' in FIG. 1 illustrating the structures of the electroluminescence display according to the second embodiment of the present disclosure.

FIG. 6 is a cross-sectional view along the cutting line I-I' and II-II' in FIG. 1 illustrating the structures of the electroluminescence display according to the third embodiment of the present disclosure.

DETAILED DESCRIPTION OF THE DISCLOSURE

Figure 2:
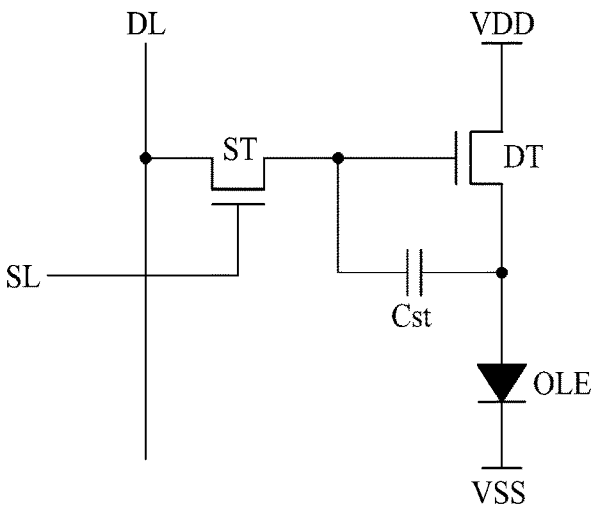
FIG. 2 is a circuit diagram illustrating a structure of one pixel in the electroluminescence display according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function or configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Figure 1:
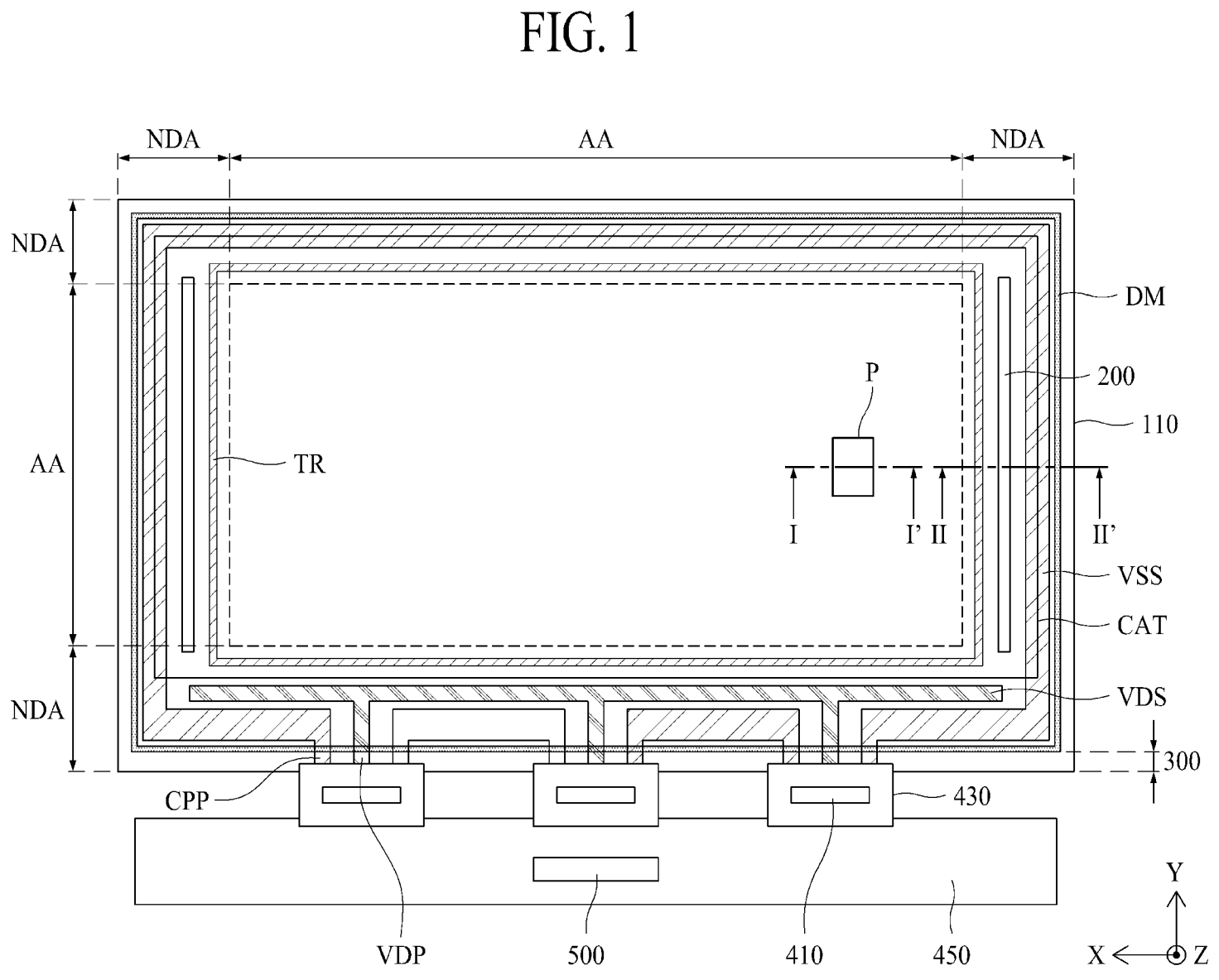

Hereinafter, referring to the attached figures, an electroluminescence display according to the present disclosure will be explained in detail. FIG. 1 is a plane view illustrating a plane view of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, the electroluminescence display according to the present disclosure comprises a substrate 110, a pixel P, a trench TR, a common electrode CAT, a common power line VSS, a driving current supply line VDS, a gate (or scan) driver 200, a dam DM, a pad portion 300, a source driving IC (Integrated Circuit) 410, a flexible circuit film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively. Each of the plurality of the pixels may include the scan line and the data line.

In the non-display area NDA, the trench TR, the common power line VSS, the driving current supply line VDS, the gate driver 200, the dam DM, the pad portion 300, the source driving IC 410, the flexible circuit film 430, the circuit board 450 and the timing controller 500 may be disposed.

The trench TR may have a shape of a closed curved loop surrounding the display area AA along the periphery of the display area AA. For example, when the display area AA have a rectangular shape, the trench TR may have a rectangular strip shape. The detailed structure of the trench TR may be explained later.

The common power line VSS is disposed at the non-display area NDA on the substrate 110. In some cases, the common power line VSS may have a loop shape surrounding the display area AA. In some examples, as shown in FIG. 1, the common power line VSS may surround three sides of the display area AA, but may be disposed in a partially disconnected shape on the other side. In one example, the common power line VSS may be disposed, as having a constant line width, along the left side, upper side and right side of the non-display area NDA adjacent to the display area AA of the substrate 110, and it may have a shape of partially broken line shape at the lower side of non-display area NDA.

The common electrode CAT is disposed over all area of the display area AA, and it may be expanded from the display area AA to the non-display area NDA so as to be physically and electrically connected to some portions of the common power line VSS. For example, the common electrode CAT may cover the display area AA, and be over the trench TR and the gate driver 200, and then be expanded to some portions of the common power line VSS.

The driving current supply line VDS may be disposed between the common power line VSS and the trench TR. In particular, it is preferable that the driving current supply line VDS is disposed at a predetermined distance from the edge of the common electrode CAT. The driving current supply line VDS is a line for supplying the driving current to the driving current line (not shown). The driving current supply line VDS may be extended to the pad portion 300 disposed at the lower side of the substrate 110 to be connected to the driving current pad VDP.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (Gate driver In Panel) type. GIP type means that the gate driver 200 is directly formed on the substrate 110.

The pad portion 300 may be an area in which pad terminals receiving various electrical signals supplied to the display area AA are disposed. For example, a common pad CPP, a driving current pad VDP, and data pads (not shown) may be disposed on the pad portion 300. The data pads receive data signals to be supplied to the data lines according to the data control signal input from the timing controller 500.

The dam DM may have a closed curve shape provided in the non-display area NDA of the substrate 110 and surrounding the display area AA. For example, the dam DM may be located at the outermost portion on the substrate 110, disposed outside the common power line VSS. It is preferable that the pad portion 300 may be disposed on the outer region of the dam DM. FIG. 1 shows the case in which the dam DM is disposed at the outermost portion, but it is not limited thereto. For another example, the dam DM may be disposed between the common power line VSS and the gate driver 200. For still another example, dam DM may be disposed between the display area AA and the gate driver 200.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (chip on film) or COP (chip on plastic) type, and may be attached to the pad portion 300 provided in the non-display area NDA outside of the display area AA of the substrate 110 by a tape automated bonding (TAB) method.

The flexible circuit film 430 may include a plurality of first link lines connecting the pad portion 300 to the source driving IC 410, and a plurality of second link lines connecting the pad portion 300 to the circuit board 450. The flexible circuit film 430 may be attached on the pad portion 300 using an anisotropic conducting film, so that the pad portion 300 may be connected to the first link lines of the flexible circuit film 430.

The circuit board 450 may be attached to the flexible circuit film 430. The circuit board 450 may include the timing controller 500. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 3:
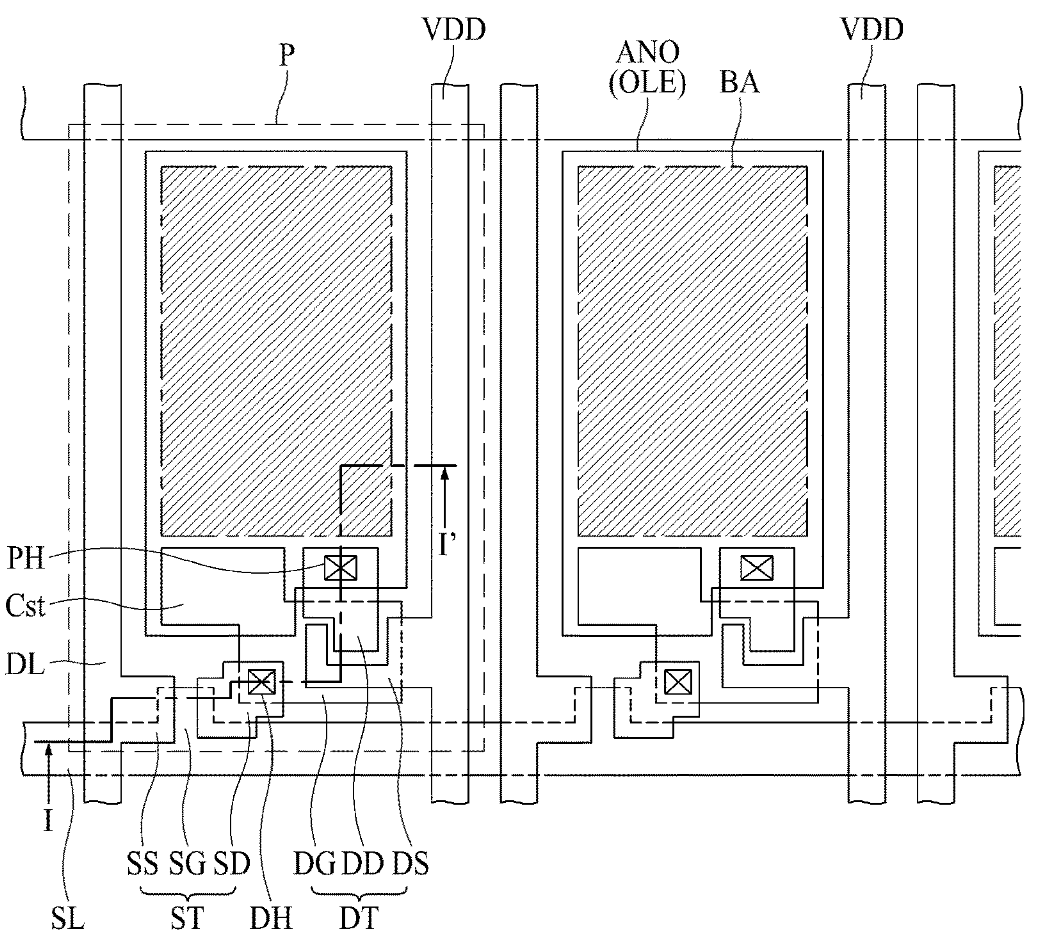
FIG. 3 is an enlarged plane view illustrating a structure of the electroluminescence display.

FIG. 2 is a circuit diagram illustrating a structure of one pixel in the electroluminescence display according to the present disclosure. FIG. 3 is an enlarged plane view illustrating a structure of the electroluminescence display.

Referring to FIGS. 1 to 3, each pixel P of an electroluminescence display may include a scan line SL, a data line DL and a driving current line VDD. A data pad (not shown) formed in the pad portion 300 of the non-display area NDA is disposed at the end of the data line DL. The driving current pad VDP formed in the pad portion 300 of the non-display area NDA is disposed at an end of the driving current line VDD. Even though not shown in the figures, an end of the scan line SL may be connected to the gate driver 200. In addition, each pixel P of the electroluminescence display may include a switching thin film transistor ST, a driving thin film transistor DT, a light emitting diode OLE, and a storage capacitance Cst. The driving current line VDD may be supplied with a high potential voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a switching semiconductor layer SA, a switching gate electrode SG, a switching source electrode SS and a switching drain electrode SD. The switching semiconductor layer SA may be first formed on the substrate 110. A gate insulating layer GI is deposited over the entire substrate 110 to cover the switching semiconductor layer SA. The switching gate electrode SG may be connected to the scan line SL, and overlapped with the switching semiconductor layer SA with the gate insulating layer GI there-between. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving semiconductor layer DA, a driving gate electrode DG, a driving source electrode DS and a driving drain electrode DD. The driving semiconductor layer DA may be first formed on the substrate 110. The gate insulating layer GI is deposited over the entire substrate 110 to cover the driving semiconductor layer DA. The driving gate electrode DG may be connected to the switching drain electrode SD of the switching thin film transistor ST via a drain contact hole DH, and overlapped with the driving semiconductor layer DA with the gate insulating layer GI there-between. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG of the driving thin film transistor DT connected to the switching drain electrode SD of the switching thin film transistor ST.

First Embodiment

Figure 4:
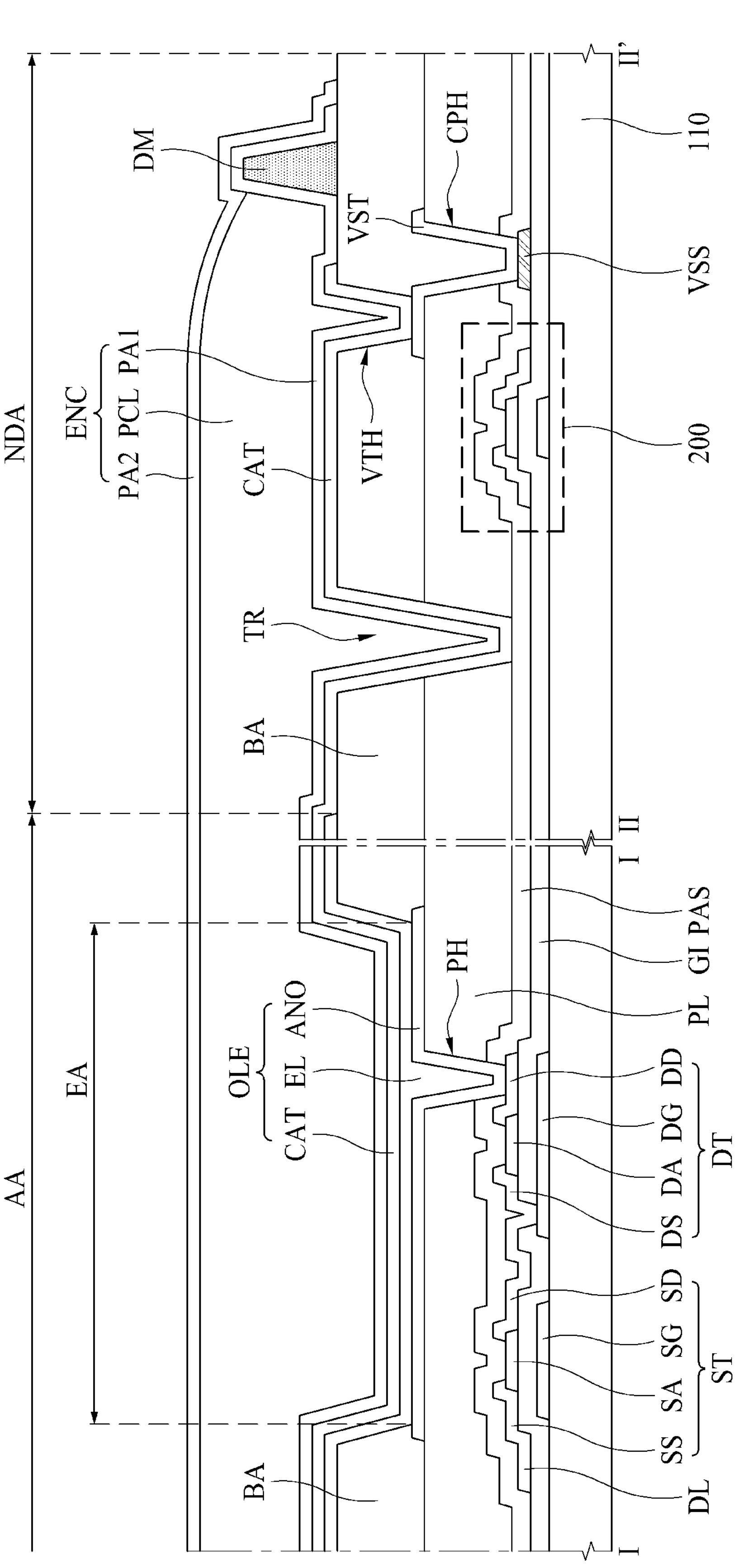
FIG. 4 is a cross-sectional view along the cutting lines I-I' and II-II' in FIG. 1, for illustrating the structure of the electroluminescence display according to the first embodiment of the present disclosure.

Hereinafter, referring to FIG. 4, an electroluminescence display according to the first embodiment of the present disclosure will be explained. FIG. 4 is a cross-sectional view along the cutting lines I-I' and II-II' in FIG. 1, for illustrating the structure of the electroluminescence display according to the first embodiment of the present disclosure. FIGS. 1 to 3 may be referred to for various embodiments of the present disclosure in common.

FIG. 4 illustrates a case in which the thin film transistors ST and DT are formed of a bottom gate structure. The bottom gate structure is that the gate electrode is formed on the substrate at first, and then the semiconductor layer is formed on the gate insulating layer covering the gate electrode. For example, at first, the gate electrodes SG and DG are formed on the substrate 110, and then the semiconductor layers SA and DA are formed on the gate insulating layer GI covering the gate electrodes SG and DG. However, it is not limited thereto. For another example, the thin film transistor may be formed as having a top gate structure. The top gate structure is a structure in which the semiconductor layer is formed at first and then the gate electrode is formed on the gate insulating layer covering the semiconductor layer. For other example, the thin film transistor may be formed as a double gate structure in which the gate electrode is formed above the semiconductor layer and below the semiconductor layer.

The switching gate electrode SG and the driving gate electrode DG are formed on the substrate 110. In addition, a gate electrode is formed at the gate driver 200. The gate insulating layer GI is deposited on the gate electrodes SG and DG as covering the whole surface of the substrate 110.

The semiconductor layers SA and DA are formed on the gate insulating layer GI. For example, the switching semiconductor layer SA is formed as overlapping with the switching gate electrode SG, and the driving semiconductor layer DA is formed as overlapping with the driving gate electrode DG. For the case that the semiconductor layers SA and DA are made of oxide semiconductor materials, it is preferable that the gate insulating layer GI is formed of the silicon oxide material for preventing penetration of hydrogen particles during the manufacturing process.

The source-drain electrodes SS, SD, DS and DD are formed on the semiconductor layers SA and DA. For example, on the switching semiconductor layer SA, the switching source electrode SS is formed as contacting one portion of the switching semiconductor layer SA, and the switching drain electrode SD is formed as contacting other portion of the switching semiconductor layer SA. In addition, on the driving semiconductor layer DA, the driving source electrode DS is formed as contacting one portion of the driving semiconductor layer DA, and the driving drain electrode DD is formed as contacting other portion of the driving semiconductor layer DA.

The passivation layer PAS is deposited on the whole surface of the substrate 110 having the switching thin film transistor ST and the driving thin film transistor DT. The passivation layer PAS may be made of an inorganic material such as silicon nitride. The planarization layer PL is deposited on the passivation layer PAS.

The surface of the substrate 110 on which the thin film transistors ST and DT are formed has level differences, so the planarization layer PL is a thin film for flattening the surface roughness. To make the level difference uniform, the planarization layer PL may be formed of an organic material. The planarization layer PL made of an organic material is stacked on the passivation layer PAS made of an inorganic material as making surface contact there-between, so a peeling phenomenon may occur at the interface of them. For example, the inorganic layer such as silicon oxide has poor interfacial properties with an organic film, thus the organic film stacked on the oxide layer may be easily peeled off. However, the nitride layer such as silicon nitride has excellent interfacial characteristics with the organic layer, so that the organic layer stacked on the nitride layer does not peel off but has excellent contact properties. Therefore, it is preferable that the passivation layer PAS in surface contact with the planarization layer PL is formed of silicon nitride.

On the other hand, silicon nitride may generate a large amount of hydrogen particles during the manufacturing process. In the case that the semiconductor layers SA and DA are made of oxide semiconductor materials, hydrogen particles may diffuse too much into the semiconductor layers SA and DA, and thus characteristics of channel regions of the semiconductor layers SA and DA may be deteriorated. To prevent this problem, the passivation layer PAS is preferably formed of silicon oxide material. However, as described above, since the planarization layer PL is formed on the passivation layer PAS, it is preferable to use a nitride layer in order to ensure excellent interfacial properties. Therefore, it is preferable that the passivation layer PAS may be formed to include an oxide layer made of silicon oxide at a lower layer and a nitride layer made of silicon nitride material thereon. A pixel contact hole PH exposing a part of the drain electrode DD of the driving thin film transistor DT is formed at the passivation layer PAS and the planarization layer PL.

The light emitting diode OLE may include an anode electrode ANO, an emission layer EL and a cathode electrode CAT. The light emitting diode OLE may emit the light according to the amount of the electric current controlled by the driving thin film transistor DT. In other word, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line VSS where a low-level potential voltage is supplied. That is, the light emitting diode OLE may be driven by the high-level voltage controlled by the driving thin film transistor DT and the low-level voltage supplied from the low-level voltage line VSS.

On the upper surface of the planarization layer PL, an anode electrode ANO may be formed. The anode electrode ANO may be connected to the drain electrode DD of the driving thin film transistor DT via the pixel contact hole PH. For the top emission type in which the emitted light may be provided to the direction opposite the substrate 110, it is preferable that the anode electrode ANO may include a metal material with excellent reflection ratio. For example, the anode electrode ANO may include at least any one of silver (Ag), aluminum (Al), molybdenum (Mo), gold (Au), magnesium (Mg), calcium (Ca), and barium (Ba) or an alloy metal including any two of them.

In the case of an ultra-high-resolution electroluminescence display, it is preferable to have a top emission type. In the top emission type, it is preferable that the anode electrode ANO has a maximum area in a pixel area defined by the data line DL, the driving current line VDD, and the scan line SL. Therefore, the thin film transistor ST and DT may be disposed under the anode electrode ANO to overlap the anode electrode ANO. In addition, some portions of the data line DL, the driving current line VDD, and the scan line SL may overlap with the anode electrode ANO.

A bank BA is formed on the anode electrode ANO. The bank BA may cover edge (or circumference) portions of the anode electrode ANO, and expose most central portions of the anode electrode ANO. The central portions of the anode electrode ANO exposed by the bank BA may be defined as the emission area EA.

An emission layer EL may be deposited on the anode electrode ANO and the bank BA. The emission layer EL may be deposited over the whole surface of the display area AA on the substrate 110, as covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include at least any one of blue-light emission layer, green-light emission layer and red-light emission layer as corresponding to the color allocated to the pixel. In this case, the emission layer EL may be disposed only inside the emitting area defined by the bank BA. In addition, the light emitting diode OLE may further include at least one functional layer for enhancing the light emitting efficiency and/or the service lifetime of the emission layer EL.

The cathode electrode CAT may be disposed on the emission layer EL. The cathode electrode CAT may be stacked on the emission layer EL as being surface contact each other. The cathode electrode CAT may be formed as one sheet element over the entire area of the substrate 110 as being commonly connected to whole emission layers EL disposed at all pixels. In the case of the bottom emission type, the cathode electrode CAT may include metal material having excellent light reflection ratio. For example, the cathode electrode CAT may be made of a transparent conductive material including indium-tin-oxide (ITO) and indium-zinc-oxide (IZO).

In the display area AA, a plurality of pixels P may be disposed in a matrix manner. Each pixel P may include the switching thin film transistor ST, the driving thin film transistor DT and the light emitting diode OLE.

In the non-display area NDA, the trench TR, the gate driver 200, the common power line VSS and the dam DM are formed. For example, the gate driver 200 may further include a thin film transistor having the same structure with the switching thin film transistor ST and/or the driving thin film transistor DT formed in the display area AA. The common power line VSS may disposed as surrounding the gate driver 200 at the outer side of the display area AA. The common power line VSS is for supplying the common voltage (or low-level voltage) to the common electrode CAT, so it is preferable that the common power line VSS is made of metal material having relatively lower resistance. For example, the common power line VSS may be made of the same material and disposed at the same layer with the source-drain electrodes SS, SD, DS and DD.

The trench TR is formed by removing some portions of the bank BA and the planarization layer PL made of organic material. The trench TR may be disposed as being a closed loop shape surrounding the display area AA, in a plane view. The bank BA and the planarization layer PL may be disconnected by the trench TR, as being expanded from the display area AA to the non-display area NDA. When moisture intrudes from the outside of the substrate 110 through the planarization layer PL and the bank BA, and then propagates toward the display area AA, the moisture does not propagate to the display area AA because the connectivity of the organic layer is disconnected by the trench TR.

The cathode electrode CAT is disposed as covering from the display area AA to the non-display area NDA. To supply the common voltage to the cathode electrode CAT, the cathode electrode CAT should be physically and/or electrically connected to the common power line VSS. Therefore, it is preferable that the cathode electrode CAT is extended to the common power line VSS disposed at the outermost side of the substrate 110. The cathode electrode CAT makes surface contact with the emission layer EL and/or the bank BA in the display area AA. The cathode electrode CAT extends as covering the concave surface of the trench TR and the gate driver 200, and then connected to the common power line VSS, in the non-display area NDA.

For an example, the common power line VSS is exposed through the common contact hole CPH formed by removing some portions of the planarization layer PL. A common line terminal VST is formed of the same material and at the same layer with the anode electrode ANO, on the planarization layer PL. The common line terminal VST is connected to the common power line VSS via the common contact hole CPH. The bank BA is deposited on the common line terminal VST. The cathode electrode CAT is deposited on the bank BA. The common line terminal VST is connected to the cathode electrode CAT through the common pad contact hole VTH formed by removing some portions of the bank BA.

The dam DM is formed on the bank BA at the outside from the common power line VSS. The dam DM is the element for defining range of the encapsulation layer ENC described below. The dam DM may have a barrier rib structure having a predetermined width along an outer side of the common power line VSS surrounding the display area AA.

After forming the light emitting diode OLE by depositing the cathode electrode CAT, an encapsulation layer ENC is deposited on the cathode electrode CAT. The encapsulation layer ENC may include a first inorganic layer PA1, an organic layer PCL and a second inorganic layer PA2, sequentially stacked. The first inorganic layer PA1 may be directly deposited on the cathode electrode CAT to form surface contact with the cathode electrode CAT. The first inorganic layer PA1 is stacked along the concave shape of the trench TR, covers the gate driver 200 and extends over the dam DM. The organic layer PCL is deposited on the first inorganic layer PA1, and is disposed confined to the inner region without exceeding the dam DM. The second inorganic layer PA2 is deposited on the organic layer PCL. The second inorganic layer PA2 covers the entire surface of the organic layer PCL and extends over the dam DM. The second inorganic layer PA2 makes surface contact with the first inorganic layer PA1 on the upper surface and outer wall surface of the dam DM. Accordingly, the organic layer PCL may have a sealed structure between the first inorganic layer PA1 and the second inorganic layer PA2.

For the electroluminescence display according to the first embodiment, the trench TR surrounding the display area AA is disposed in the non-display area NDA closed to the display area AA. The trench TR is formed by removing the bank BA and the planarization layer PL made of organic materials, which are continuously stacked between the display area and the non-display area NDA. The trench TR may cut off a path through which foreign materials such as moisture penetrating from the side portions of the substrate 110 diffuses from the non-display area NDA to the display area AA. As a result, the performance of the light emitting elements and the driving elements disposed in the display area AA may be protected for a long period of time.

Second Embodiment

Figure 5:
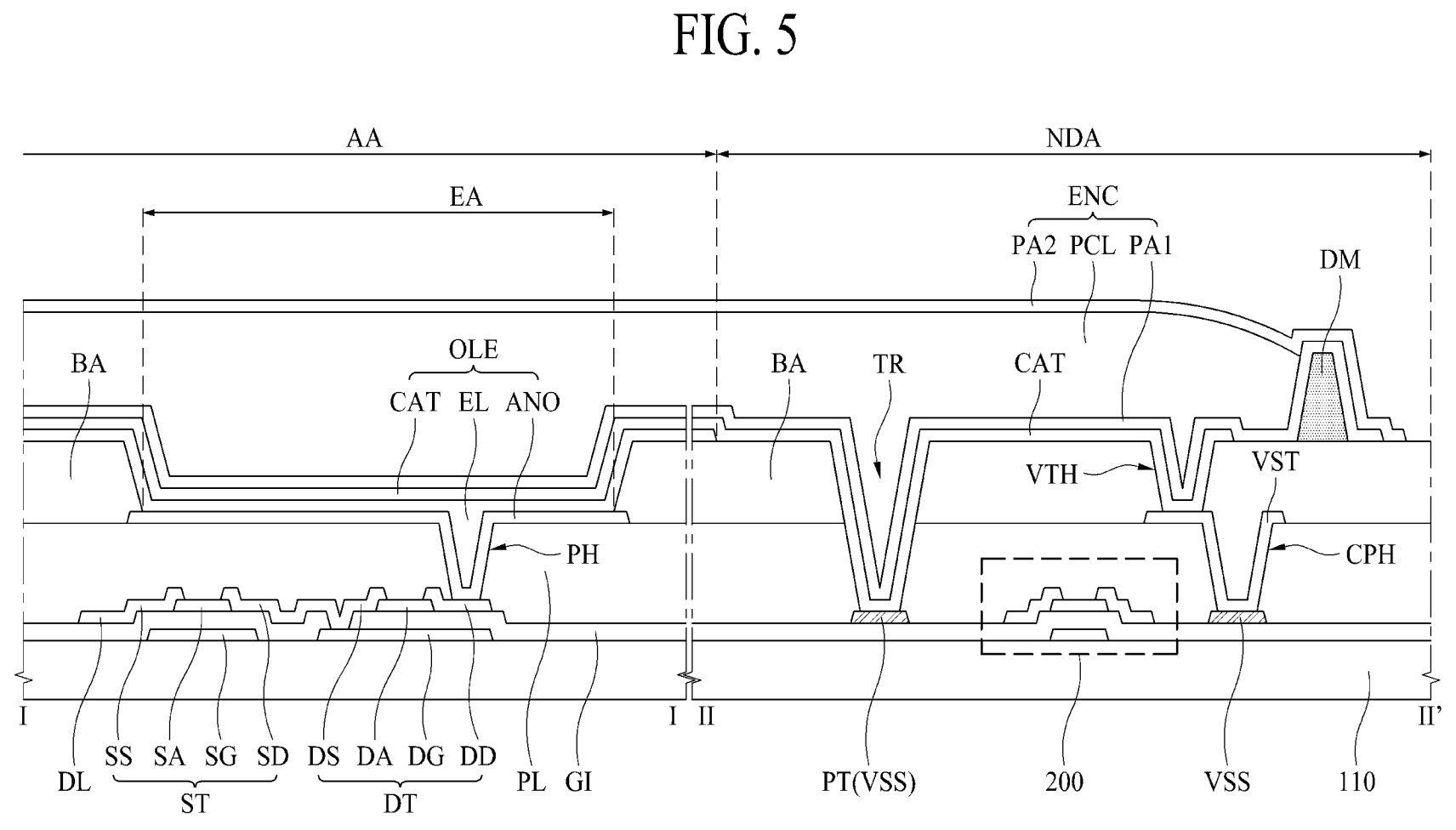

Hereinafter, referring to FIG. 5, an electroluminescence display according to the second embodiment will be explained. FIG. 5 is a cross-sectional view along the cutting line I-I' and II-II' in FIG. 1 illustrating the structures of the electroluminescence display according to the second embodiment of the present disclosure. The structure of the electroluminescence display shown in FIG. 5 is almost the same as the structure of the first embodiment shown in FIG. 4. Comparing the drawings, there is a difference in which the passivation layer PAS is not stacked but the metal protection layer PT is further formed under the trench TR, in FIG. 5.

In the description for the second embodiment, the structure of the trench TR in the case where the passivation layer PAS is not formed will be explained. In this case, when the trench TR is formed after forming the planarization layer PL and the bank BA on the surface of the substrate 110 on which the thin film transistor ST and DT are formed, the gate insulating layer GI is exposed at the bottom surface of the trench TR.

For the case that the gate insulating layer GI is made of an oxide layer such as silicon oxide, the lifting off phenomenon may be occurred between the gate insulating layer GI exposed at the bottom surface of the trench TR and the planarization layer PL, which may cause peeling off problem of the planarization layer PL over the whole area. As the result, the display may be damaged.

To prevent this problem, it is preferable to form a metal protection layer PT on the bottom of the trench TR. The metal protection layer PT having excellent interfacial characteristics between the oxide layer and the organic layer is formed at the bottom of the trench TR, thereby the peeling-off of the planarization layer PL, which is an organic layer, may be prevented. The metal protection layer PT is deposited directly under the planarization layer PL. Therefore, it is preferable that the metal protection layer PT is made of the same metal material as the source-drain electrodes SS, SD, DS and DD. For example, the metal protection layer PT may be formed of the same material on the same layer as the common power line VSS.

In this structure, the metal protection layer PT may have a structure in which it is connected to the cathode electrode CAT stacked along the surface of the trench TR. Accordingly, when it is necessary, the metal protection layer PT may be configured to be connected to the common power line VSS.

In this structure, the cathode electrode CAT is connected to the common power line VSS surrounding the outermost periphery of the substrate 110. Further, the cathode electrode CAT is connected to metal protection layer PT having substantially the same width and shape as the trench TR in a plane view. In particular, in the case of the top emission type, by applying the metal protection layer PT, the excellent image quality may be acquired by lowering the resistance of the cathode electrode CAT formed of a transparent conductive material having higher electrical resistance than a metal material.

In the electroluminescence display according to the second embodiment, a trench TR is disposed adjacent to the display area AA in the non-display area NDA to surround the display area AA. The trench TR is formed by removing the bank BA and the planarization layer PL which are made of an organic material and continuously stacked over the display area AA and the non-display area NDA. The trench TR may cut off a path through which foreign material, such as moisture, penetrating from the side of the substrate 110, diffuses from the non-display area NDA into the display area AA. As a result, the performance of the light emitting elements and the driving elements disposed in the display area AA may be protected for a long Period of time.

In the above-described first and second embodiments, it is possible to prevent a foreign material, such as moisture, penetrating from the outside, from being diffused into the display area AA. Referring to the cross-sectional structure of the trench TR, the trench TR may have a depth corresponding to the sum of the thickness of the planarization layer PL and the bank BA. The planarization layer PL and the bank BA include an organic material and may have a relatively thick thickness compared to other inorganic layers. Therefore, as the cathode electrode CAT is stacked along the shape of the trench TR, the cathode electrode CAT may be thinly stacked on the sidewall of the trench TR.

When the thickness of the cathode electrode CAT is thinly stacked on the sidewall of the entire trench TR surrounding the periphery of the display area AA, a problem, in that the voltage of the common power line VSS increases due to an increase in resistance at this thinly deposited portions, may be occurred. Alternatively, heating or loss due to heat may be occurred. As a result, elements of the display may be damaged, resulting in a decrease in reliability, or a phenomenon in which the color of an image becomes yellowish may occur.

Hereinafter, in the third and the fourth embodiments, an electroluminescence display including a trench TR and having a structure capable of maintaining a common voltage normally by ensuring a constant thickness of a cathode electrode CAT stacked on an inner sidewall of the trench TR will be described.

Third Embodiment

Figure 6:
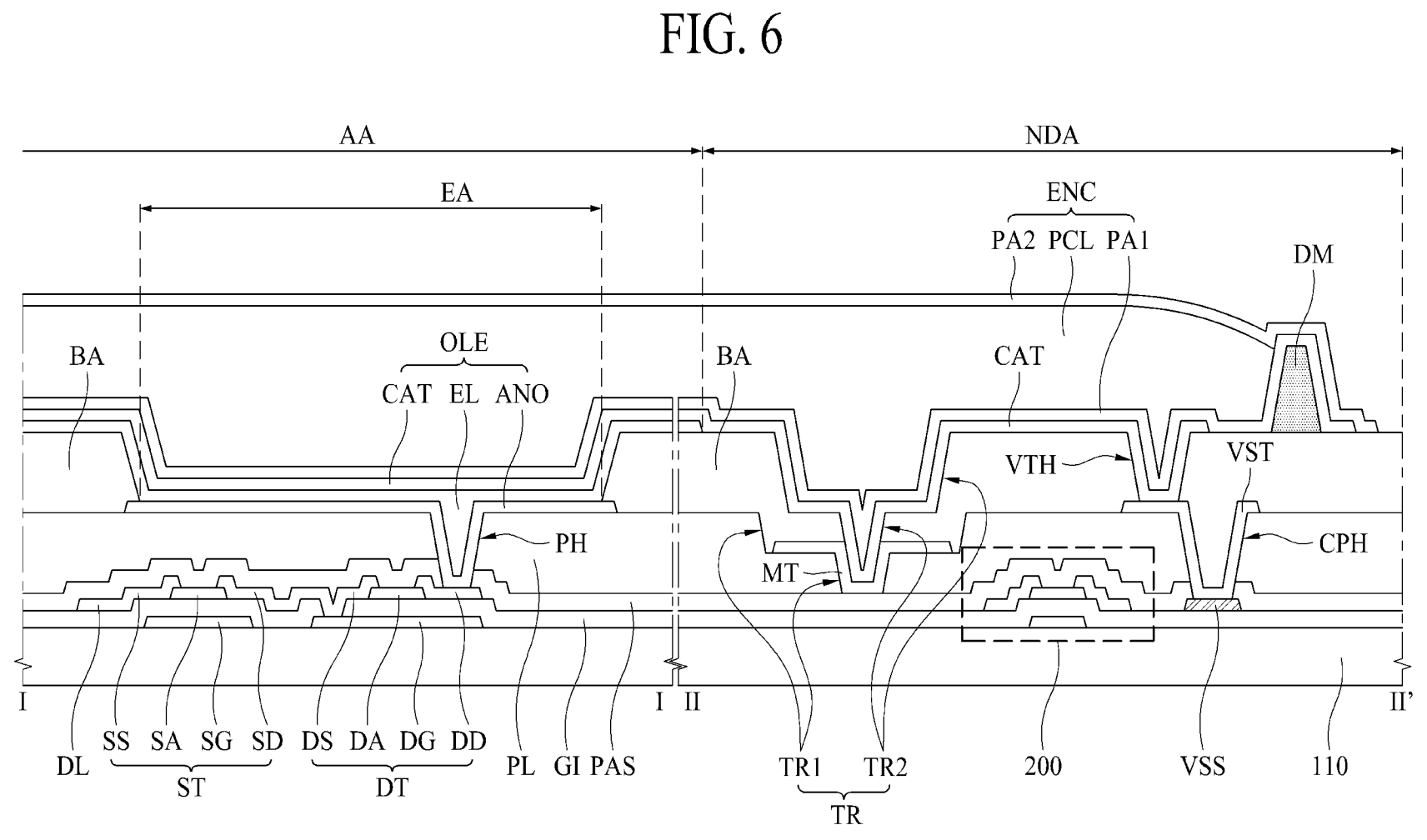

Hereinafter, referring to FIG. 6, an electroluminescence display according to the third embodiment will be explained. FIG. 6 is a cross-sectional view along the cutting line I-I' and II-II' in FIG. 1 illustrating the structures of the electroluminescence display according to the third embodiment of the present disclosure. The structure of the electroluminescence display shown in FIG. 6 is almost the same as the structure of the first embodiment shown in FIG. 4. Comparing the drawings, there is a difference in the shape of the trench TR and there is another difference in which a connection pattern MT is further included for connecting to the cathode electrode CAT. In the following description, the trench TR having the main characteristics of the third embodiment will be mainly described. The descriptions of elements not described hereinafter but described by drawing numerical symbols are the same as those described above.

Trench TR includes a first trench TR1 and a second trench TR2. The first trench TR1 is formed by removing the planarization layer PL corresponding to a predetermined width. The second trench TR2 is formed by removing the bank BA to have a width equal to or greater than that of the first trench TR1.

In particular, it is preferable to form a low step portion in the trench TR by lowering the heights of the planarization layer PL and the bank BA in the portion where the trench TR is formed. For example, when forming the first trench TR1, the planarization layer PL corresponding to a wide width of the first trench TR1 is removed to a certain depth to form a low step portion, and the remaining planarization layer PL corresponding to a narrow width is removed from the low step portion to expose some portions of the passivation layer PAS disposed under the planarization layer PL. Thereafter, when the second trench TR2 is formed, the bank BA corresponding to a wide width of the second trench TR2 is removed to a certain depth to form a low step portion, and the remaining bank BA corresponding to a narrow width is removed from the low step portion to expose the portions of the passivation layer PAS with the first trench TR1.

For example, the level difference of the planarization layer PL may be corresponding to ½ of the entire thickness of the planarization layer PL. In addition, the level difference of the bank BA may be formed as that the height from the upper surface of the passivation layer PAS to the lower step portion corresponds to the height from the passivation layer PAS to the uppermost layer of the planarization layer PL.

In addition, the first trench TR1 formed at the planarization layer PL may include a wide-width region and a narrow-width region. At the same time, the second trench TR2 formed at the bank BA may include a wide-width region and a narrow-width region. The narrow-width region of the first trench TR1 may be overlapped with the narrow-width region of the second trench TR2 so to form the trench TR.

As the result, the depth of the total trench TR including the first trench TR1 and the second trench TR2 may be corresponding to the thickness of the planarization layer PL. In this case, when the cathode electrode CAT is deposited on the trench TR, it is stacked while covering the wide-width region of the second trench TR2 so as to cover the trench TR. The sidewall of the trench TR according to the third embodiment has a low depth by comparing with the trench TR according to the first embodiment shown in FIG. 4. Therefore, the problem of thinning the thickness of the cathode electrode CAT applied to the sidewall of the trench TR does not occur. As a result, problems such as the increased resistance of the cathode electrode CAT, the generation of heat, or the dissipation due to heat is prevented.

In addition, in the third embodiment, a connection pattern MT may be further formed between the first trench TR1 and the second trench TR2. Since the connection pattern MT is formed on the planarization layer PL, it is preferable that the connection pattern MT is made of the same material as the anode electrode ANO. The connection pattern MT may be disposed to correspond to the trench TR. Even though it is not shown in drawings, the connection pattern MT may be overlapped with the trench TR. For example, in a plane view, the trench TR may have a closed loop shape surrounding the display area AA. In the third embodiment, the connection pattern MT is not a necessary element and may be omitted when it is necessary.

In addition, the connection pattern MT may have the function for lowering the resistance of the cathode electrode CAT by being physically and electrically connected to the cathode electrode CAT. For example, in the case of the top emission type, since the cathode electrode CAT is made of a transparent conductive material, the sheet resistance of the cathode electrode CAT is higher than that of a metal material. Meanwhile, the connection pattern MT is formed of a metal material having the same high light reflectance and low sheet resistance as that of the anode electrode ANO. Accordingly, while the cathode electrode CAT is electrically connected to the connection pattern MT through the trench TR, the resistance of the cathode electrode CAT may be reduced.

In addition, the connection pattern MT is deposited on the inner wall and the bottom surface of the first trench TR1. Therefore, when moisture penetrating from the outside propagates to the display area AA through the planarization layer PL, the moisture may be absorbed by the connection pattern MT while being blocked by the first trench TR1. Accordingly, the connection pattern MT has an effect of blocking or delaying the propagation of moisture.

Fourth Embodiment

Figure 7:
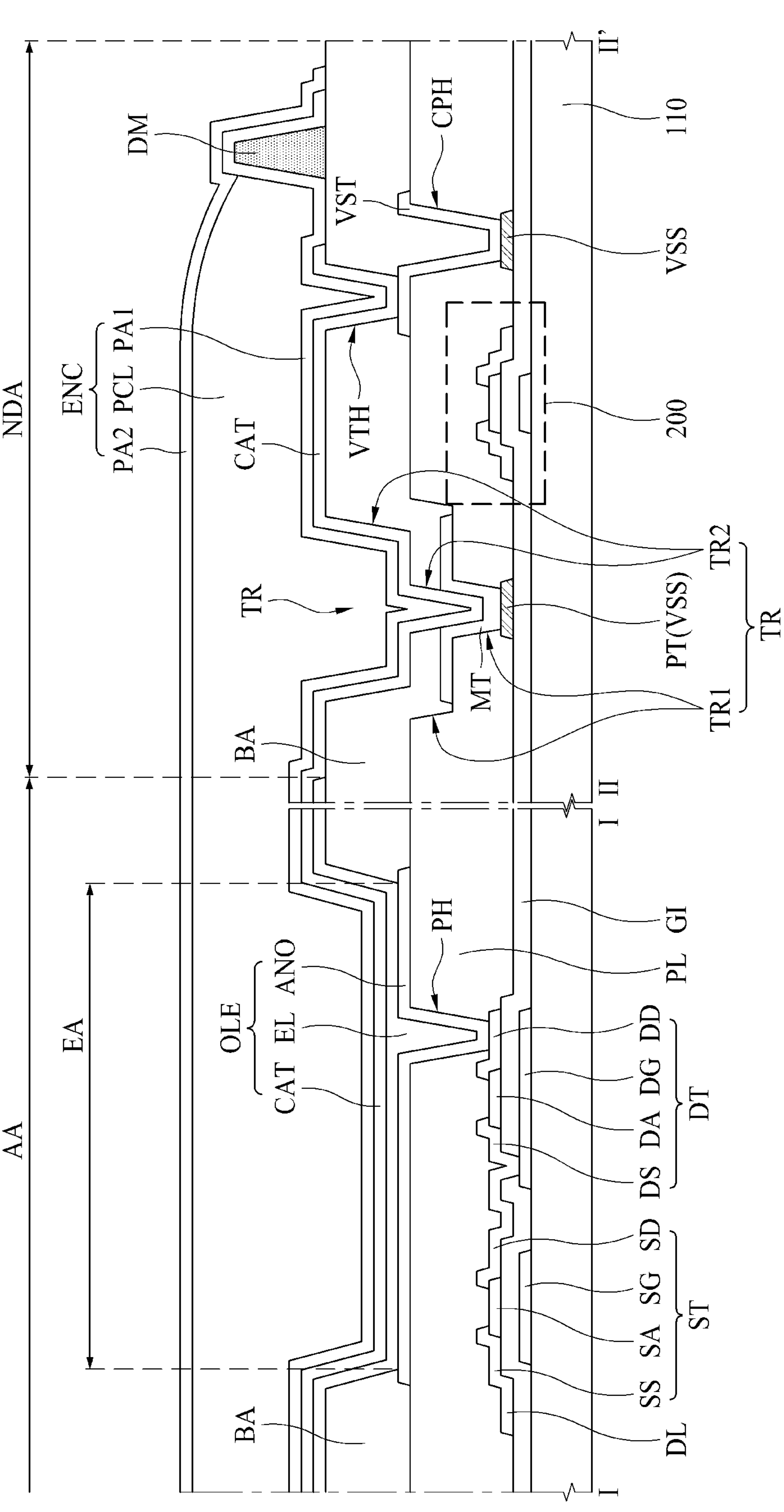
FIG. 7 is a cross-sectional view along the cutting line I-I' and II-II' in FIG. 1 illustrating the structures of the electroluminescence display according to the fourth embodiment of the present disclosure.

Hereinafter, referring to FIG. 7, an electroluminescence display according to the fourth embodiment will be explained. FIG. 7 is a cross-sectional view along the cutting line I-I' and II-II' in FIG. 1 illustrating the structures of the electroluminescence display according to the fourth embodiment of the present disclosure. The structure of the electroluminescence display shown in FIG. 7 is almost the same as the structure shown in FIG. 6. Comparing the drawings, there are differences in which there is no passivation layer PAS, but a metal protection layer PT is further included under the trench TR. The descriptions of elements not described hereinafter but described by drawing numerical symbols are the same as those described above.

As in the fourth embodiment, when the passivation layer PAS is not formed, a planarization layer PL and a bank BA are formed on the surface of the substrate 110 on which the thin film transistors ST and DT are formed. After that, when the trench TR is formed, the bottom surface of the trench TR exposes the gate insulating layer GI. When the gate insulating layer GI is made of an oxide film such as silicon oxide, the lifting-off occurs between the gate insulating layer GI and the planarization layer PL exposed on the bottom surface of the trench TR, and then the peeling-off occurs. So that the entire display may be damaged.

In order to prevent this problem, it is preferable that a metal protection layer PT may be formed at the bottom of the trench TR. A metal protection layer PT having excellent interfacial characteristics between a oxide layer and an organic layer is formed at the bottom of the trench TR. Thereby, the planarization layer PL, which is an organic layer, may be prevented from being peeling off. The metal protection layer PT may be disposed under the planarization layer PL. Therefore, it is preferable that the metal protection layer PT may be made of the same metal material as the source-drain electrodes SS, SD, DS and DD. For example, the metal protection layer PT may be formed of the same material and disposed on the same layer as the common power line VSS.

With this structure, the metal protection layer PT may be connected to the cathode electrode CAT stacked along the surface of the trench TR. Accordingly, when it is necessary, the metal protection layer PT may be connected to the common power line VSS.

In the structure further including the connection pattern MT, the metal protection layer PT is physically and electrically connected to the connection pattern MT. In this case, the cathode electrode CAT may be electrically connected to the metal protection layer PT through the connection pattern MT. Also, in this case, the metal protection layer PT may be connected to the common power line VSS.

In the electroluminescence display according to the fourth embodiment, a trench TR is disposed adjacent to the display area AA in the non-display area NDA and surrounds the display area AA. The trench TR is formed by removing the bank BA and the planarization layer PL which are made of organic materials and continuously deposited over the display area AA and the non-display area NDA. The trench TR may cut off a path through which foreign material, such as moisture, penetrating from the side of the substrate 110 may diffuse from the non-display area NDA to the display area AA. Furthermore, by covering the inner wall of the trench TR with the connection pattern MT and covering the bottom surface of the trench TR with the metal protection layer PT, a moisture path propagating through the organic material may be blocked. In addition, due to the trench TR, the peeling-off of the planarization layer PL may be prevented. As a result, the performance of the light emitting elements and the driving elements disposed in the display area AA may be protected for a long period of time.

Fifth Embodiment

Hereinafter, referring to FIG. 8, an electroluminescence display according to the fifth embodiment will be explained.

Figure 8:
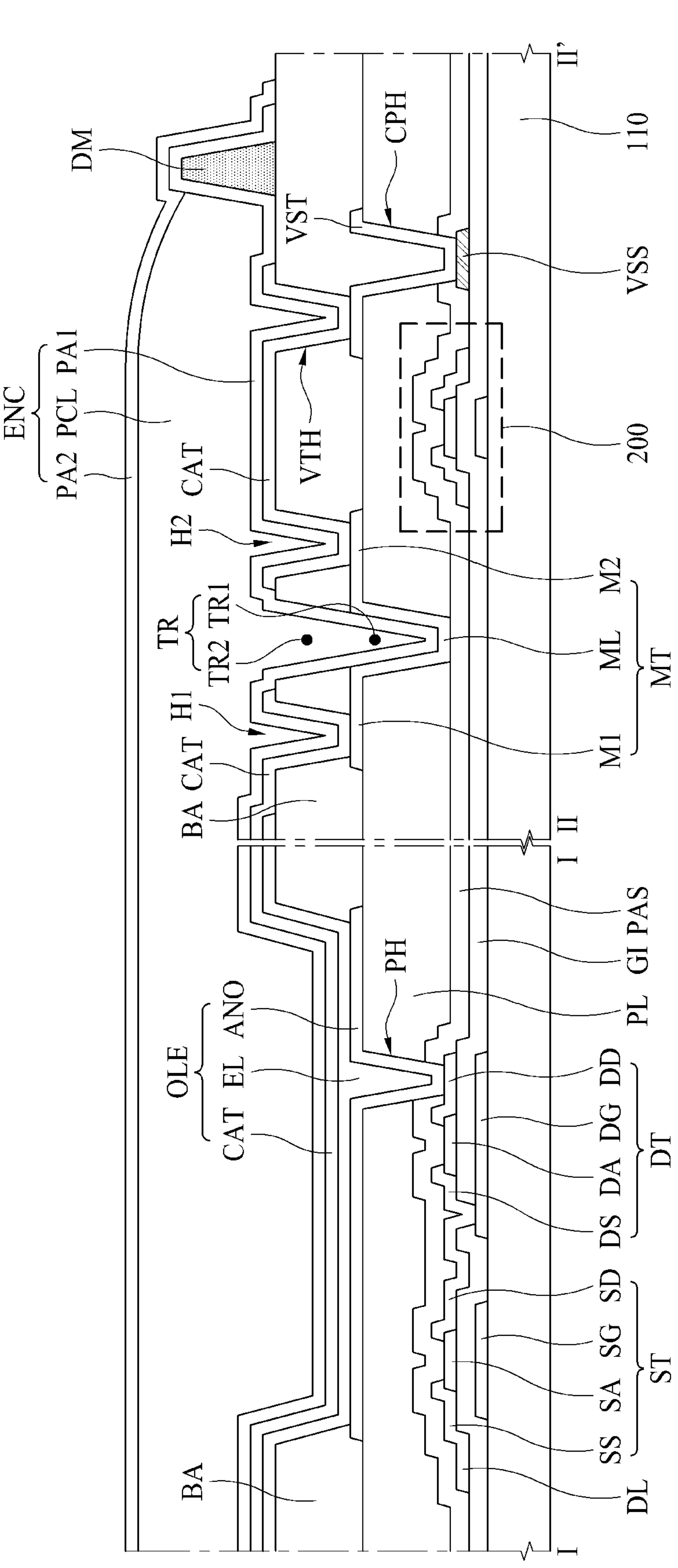
FIG. 8 is a cross-sectional view along the cutting line I-I' and II-II' in FIG. 1 illustrating the structures of the electroluminescence display according to the fifth embodiment of the present disclosure.

FIG. 8 is a cross-sectional view along the cutting line I-I' and II-II' in FIG. 1 illustrating the structures of the electroluminescence display according to the fifth embodiment of the present disclosure. The structure of the electroluminescence display shown in FIG. 8 is almost the same as the structure of the first embodiment shown in FIG. 4. Comparing the drawings, there is a difference in the shape of the trench TR, and a difference in the structure for connection between the connection pattern MT and the cathode electrode CAT. In the following description, the main characteristics of the fifth embodiment will be mainly described. The descriptions of elements not described hereinafter but described by drawing numerical symbols are the same as those described above.

The trench TR includes a first trench TR1, a connection pattern MT and a second trench TR2. The first trench TR1 may be formed by removing some portions of the planarization layer PL corresponding to a predetermined width. The second trench TR2 may be formed by removing the bank BA as extended from the first trench TR1. The connection pattern MT is disposed between the planarization layer PL and the bank BA, and has a shape for covering the first trench TR1.

For example, the first trench TR1 may be formed by removing some portions of the planarization layer PL corresponding a predetermined width so as to expose some portions of the passivation layer PAS disposed under the planarization layer PL. The second trench TR2 is formed by removing the bank BA as overlapping with the first trench TR1 so as to expose some portions of the passivation layer PAS with the first trench TR1.

The connection pattern MT may include a first plane part M1, a second plane part M2 and a connection part ML. The first plane part M1 may be disposed at the upper surface of the planarization layer PL disposed at the first side of the first trench TR1, in which the first side is closed to the display area AA. The second plane part M2 may be disposed on the upper surface of the planarization layer PL disposed at the second side of the first trench TR1, in which the second side is closed to the outer side of the substrate 110. The connection part ML may connect the first plane part M1 and the second plane part M2. In particular, the connection part ML may be deposited along the inner sidewall and bottom surface of the first trench TR1.

The connection pattern MT is formed on the planarization layer PL. The bank BA may include the second trench TR2, a first contact hole H1 and a second contact hole H2. The second trench TR2 may be formed by removing some of the bank BA as the second trench TR2 is expanded from the first trench TR1. The first contact hole H1 may expose some of the first plane part M1 of the connection pattern MT. The second contact hole H2 may expose some of the second plane part M2 of the connection pattern MT.

When the cathode electrode CAT is deposited on the substrate 110 having the trench TR structure, the cathode electrode CAT extends from the display area AA to the non-display area NDA as deposited on the substrate 110. The cathode electrode CAT contacts the first plane part M1 of the connection pattern MT through the first contact hole H1 and contacts the second plane part M2 of the connection pattern MT through the second contact hole H2. However, it is preferable no to deposit the cathode electrode CAT in the trench TR.

For example, after the cathode electrode CAT is deposited on the entire substrate 110, the cathode electrode CAT stacked in the trench TR may be etched and removed. For another example, the cathode electrode CAT may be deposited on the entire substrate 110 using a mask blocking the trench TR.

As a result, since the cathode electrode CAT is not deposited on the sidewall of the trench TR, the problem of thinning the thickness of the cathode electrode CAT at the sidewall of the trench TR does not occur. On the other hand, the cathode electrode CAT is connected to the connection pattern MT through the first contact hole H1 and the second contact hole H2, so that the cathode electrode CAT may be connected to the common power line VSS disposed in the non-display area NDA. Accordingly, the cathode electrode CAT extending from the display area AA of the substrate 110 to the non-display area NDA may maintain connectivity without being formed on the sidewall of the trench TR. Therefore, by not forming a portion that may increase resistance of the cathode electrode CAT, the problems such as the heat generation or the loss due to heat may be prevented.

The connection pattern MT may function to lower the resistance of the cathode electrode CAT by being physically and electrically connected to the cathode electrode CAT. For example, in the case of the top emission type, since the cathode electrode CAT is made of a transparent conductive material, the sheet resistance of the cathode electrode CAT is higher than that of the metal materials. Meanwhile, the connection pattern MT is formed of a metal material having the same high light reflectance and low sheet resistance as that of the anode electrode ANO. Accordingly, while the cathode electrode CAT is electrically connected to the connection pattern MT through the first contact hole H1 and the second contact hole H2, resistance of the cathode electrode CAT may be reduced.

Moreover, the connection pattern MT is deposited on the inner wall and the bottom surface of the first trench TR1. Therefore, when moisture penetrating from the outside propagates to the display area AA through the planarization layer PL, the moisture may be absorbed by the connection pattern MT and blocked by the first trench TR1. Accordingly, the connection pattern MT has an effect of blocking or delaying the propagation of moisture.

Sixth Embodiment

Figure 9:
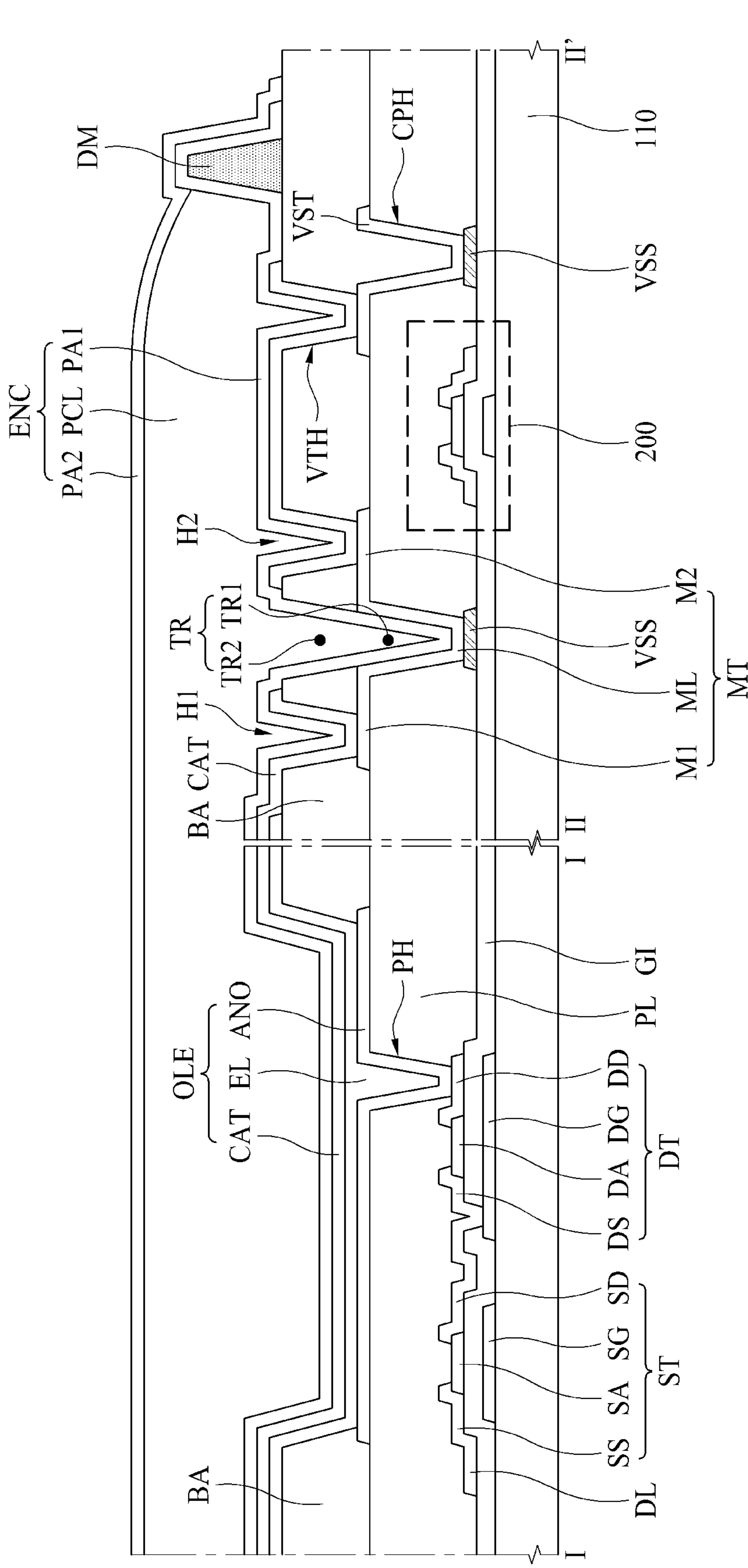
FIG. 9 is a cross-sectional view along the cutting line I-I' and II-II' in FIG. 1 illustrating the structures of the electroluminescence display according to the sixth embodiment of the present disclosure.

Hereinafter, referring to FIG. 9, an electroluminescence display according to the sixth embodiment will be explained. FIG. 9 is a cross-sectional view along the cutting line I-I' and II-II' in FIG. 1 illustrating the structures of the electroluminescence display according to the sixth embodiment of the present disclosure. The structure of the electroluminescence display shown in FIG. 9 is almost the same as the structure shown in FIG. 8. Comparing the drawings, there are differences in which there is no passivation layer PAS, but a metal protection layer PT is formed at the lower portion of the trench TR. The descriptions of elements not described hereinafter but described by drawing numerical symbols are the same as those described above.

As in the sixth embodiment, when the passivation layer PAS is not formed, a planarization layer PL and a bank BA are formed on the surface of the substrate 110 on which the thin film transistors ST and DT are formed. After that, when the trench TR is formed, the bottom surface of the trench TR exposes some of the gate insulating layer GI. When the gate insulating layer GI is made of an oxide film such as silicon oxide, the lifting-off occurs between the gate insulating layer GI and the planarization layer PL exposed on the bottom surface of the trench TR, and then the peeling-off occurs. As such, the entire display may be damaged.

In order to prevent this problem, it is preferable that a metal protection layer PT may be formed at the bottom of the trench TR. A metal protection layer PT having excellent interfacial characteristics between a oxide layer and an organic layer is formed at the bottom of the trench TR. Thereby, the planarization layer PL, which is an organic layer, may be prevented from being peeling off. The metal protection layer PT may be disposed under the planarization layer PL. Therefore, it is preferable that the metal protection layer PT may be made of the same metal material as the source-drain electrodes SS, SD, DS and DD. For example, the metal protection layer PT may be formed of the same material and disposed on the same layer as the common power line VSS.

With this structure, the metal protection layer PT may be connected to the connection pattern MT stacked along the surface of the first trench TR1. Since the connection pattern MT is connected to the cathode electrode CAT, the metal protection layer PT is electrically connected to the cathode electrode CAT. Therefore, when it is required, the metal protection layer PT may be connected to the common power line VSS.

In the electroluminescence display according to the sixth embodiment, a trench TR is disposed adjacent to the display area AA in the non-display area NDA and surrounds the display area AA. The trench TR is formed by removing the bank BA and the planarization layer PL which are made of organic materials and continuously deposited over the display area AA and the non-display area NDA. The trench TR may cut off a path through which foreign material, such as moisture, penetrating from the side of the substrate 110 may diffuse from the non-display area NDA to the display area AA. Furthermore, by covering the inner wall of the trench TR with the connection pattern MT and covering the bottom surface of the trench TR with the metal protection layer PT, a moisture path propagating through the organic material may be blocked. In addition, due to the trench TR, the peeling-off of the planarization layer PL may be prevented. As a result, the performance of the light emitting elements and the driving elements disposed in the display area AA may be protected for a long period of time.

Seventh Embodiment

Figure 10:
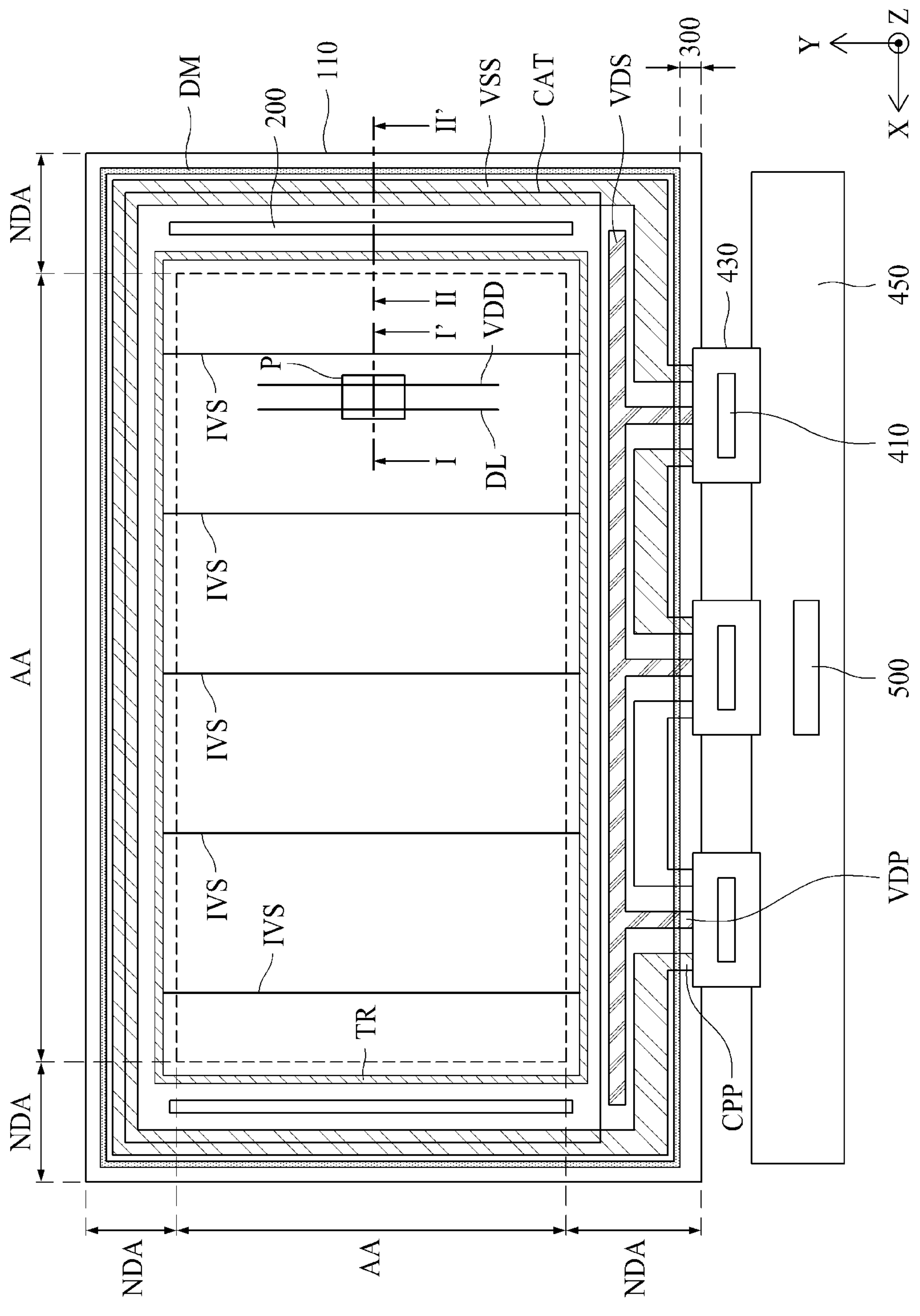
FIG. 10 is a plane view illustrating a structure of the electroluminescence display according to the seventh embodiment of the present disclosure.
Figure 11:
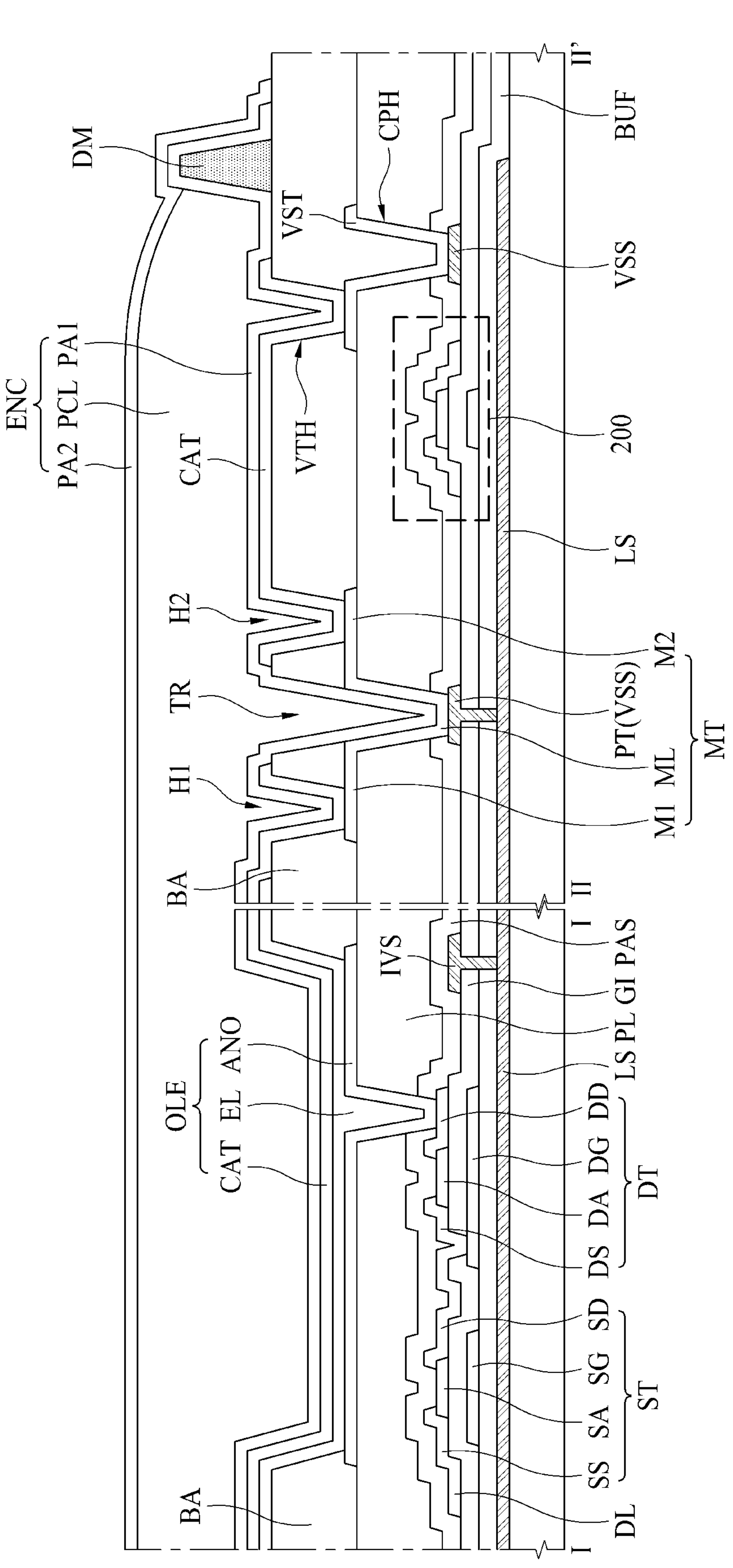
FIG. 11 is a cross-sectional view along the cutting line I-I' and II-II' in FIG. 10 illustrating the structures of the electroluminescence display according to the seventh embodiment of the present disclosure.

Hereinafter, referring to FIGS. 10 and 11, an electroluminescence display according to the seventh embodiment will be explained. FIG. 10 is a plane view illustrating a structure of the electroluminescence display according to the seventh embodiment of the present disclosure. FIG. 11 is a cross-sectional view along the cutting line I-I' and II-II' in FIG. 10 illustrating the structures of the electroluminescence display according to the seventh embodiment of the present disclosure. Referring to the structure of the electroluminescence display as shown in FIGS. 10 and 11, it has a structure very similar to that of FIG. 1 or FIG. 9. There is a deference in which an auxiliary line LS is further included on the substrate 110. The descriptions of elements not described hereinafter but described by drawing numerical symbols are the same as those described above.

Referring to FIG. 10, in the display area AA, an inner common line IVS is further included. The inner common line IVS may have a shape of a segment extended from the upper side to the lower side of the substrate 110. For example, the inner common line IVS may be disposed as being parallel to the data line DL and the driving current line VDD. The data line DL and the driving current line VDD may be disposed at each pixel column. However, one inner common line IVS may be disposed for each of the several pixel columns.

For example, the data line DL may be extended to the pad portion 300, and a data pad may be disposed at the end of the data line DL. The driving current line VDD may be connected to driving current supply line VDS disposed as being closed to the outside of the trench TR disposed at the lower side of the substrate 110. The inner common line IVS may be parallel to the driving current line VDD, and extended to the trench TR. In order for the inner common line IVS to be connected to the common power line VSS via the driving current supply line VDS, it is preferable to use a connection line disposed on another layer.

Referring to FIG. 11, the inner common line IVS may be formed of the same material as the source-drain electrodes SS, SD, DS and DD on the same layer. For example, the inner common line IVS may be disposed parallel to the data line DL in the display area AA. In this case, it is preferable to connect the inner common line IVS disposed in the display area AA to the common power line VSS disposed in the non-display area NDA.

The auxiliary line LS for connecting the inner common line IVS disposed in the display area AA and a common power line VSS disposed in the non-display area NDA is first formed on the substrate 110. On the auxiliary line LS, the buffer layer BUF may be deposited to cover the entire surface of the substrate 110.

On the buffer layer BUF, elements may be formed as shown in FIG. 9. For example, the switching thin film transistor ST, the driving thin film transistor DT and the light emitting diode OLE are formed in the display area AA. The trench TR, the gate driver 200 and the common power line VSS are formed in the non-display area NDA.

In addition, at one side of some columns of pixel P, the inner common line IVS is further disposed in the display area AA. The inner common line IVS may be extended from the trench TR disposed at the upper side of the substrate 110 to the trench TR disposed at the lower side of the substrate 110, as shown in FIG. 10. In particular, as shown in FIG. 11, the metal protection layer PT may be formed on the bottom surface of the trench TR. The inner common line IVS may be formed as a pattern for connecting the metal protection layer PT.

For another example, the inner common line IVS may be formed of the auxiliary line LS. In this case, the auxiliary line LS, which is the inner common line, may be connected to the metal protection layer PT formed at the trench TR via a contact hole penetrating the gate insulating layer GI and the buffer layer BUF disposed under the metal protection layer PT.

For another example for connecting the metal protection layer PT to the common power line VSS, the auxiliary line LS may be used. The metal protection layer PT may be disposed at the same position as the trench TR. In order to connect the metal protection layer PT formed overlapped with the trench TR to the common power line VSS disposed at the outermost side of the substrate 110, the connection line should be crossing the gate driver 200 and/or the driving current line VDS. Therefore, using the auxiliary line LS formed under the buffer layer BUF, the metal protection layer PT may be connected to the common power line VSS.

In the seventh embodiment, by connecting the metal protection layer PT formed at the trench TR and the inner common line IVS to the common power line VSS, the cathode electrode CAT may be connected to the common power line VSS via various contacting points. In this way, since the cathode electrode CAT is connected to the common power line VSS with a large number of the contacting points, the contact resistance may be reduced as much as possible, and thus, the resistance of the cathode electrode CAT may be stably lowered.

In the electroluminescence display according to the seventh embodiment, a trench TR is disposed adjacent to the display area AA in the non-display area NDA and surrounds the display area AA. The trench TR is formed by removing the bank BA and the planarization layer PL which are made of organic materials and continuously deposited over the display area AA and the non-display area NDA. The trench TR may cut off a path through which foreign material, such as moisture, penetrating from the side of the substrate 110 may diffuse from the non-display area NDA to the display area AA. Furthermore, by covering the inner wall of the trench TR with the connection pattern MT and covering the bottom surface of the trench TR with the metal protection layer PT, a moisture path propagating through the organic material may be blocked. In addition, due to the trench TR, the peeling-off of the planarization layer PL may be prevented. As a result, the performance of the light emitting elements and the driving elements disposed in the display area AA may be protected for a long period of time.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:

a substrate including a display area and a non-display area, the non-display area disposed around the display area;

a planarization layer on the display area and the non-display area;

a bank disposed in the display area and the non-display area on the planarization layer;

a cathode electrode disposed in the display area and the non-display area on the bank;

a trench disposed in the non-display area as surrounding the display area;

a common power line surrounding the display area at the outside of the trench, and connected to the cathode electrode; and a connection pattern disposed between the planarization layer and the bank where the trench is disposed, and electrically connected to the common power line, wherein the connection pattern includes:

a first plane part disposed at an upper surface of the planarization layer at a first side of the trench, a second plane part disposed at the upper surface of the planarization layer at a second side of the trench opposite the first side of the trench, and a connection part connecting the first plane part and the second plane part and disposed at an inner sidewall of the trench, wherein the trench has a recessed shape exposing an upper portion of a thin film layer disposed under the planarization layer, and wherein the bank includes:

a first contact hole exposing a portion of the first plane part; and a second contact hole exposing a portion of the second plane part, wherein the cathode electrode is connected to the first plane part via the first contact hole and to the second plane part via the second contact hole, except the connection part exposed from the trench.

2. The electroluminescence display according to claim 1, further including:

a passivation layer disposed at the display area and the non-display area, and contacting a bottom surface of the planarization layer.

3. The electroluminescence display according to claim 1, further including:

a metal protection layer overlapping the trench under the planarization layer, and including a same material as the common power line.

4. The electroluminescence display according to claim 1, wherein the cathode electrode is electrically connected to the connection pattern exposed from the trench.

5. The electroluminescence display according to claim 1, further comprising:

a common line terminal disposed on the planarization layer in the non-display area, and connecting to the common power line via a common contact hole exposing portions of the common power line, wherein the cathode electrode is connected to the common line terminal via a common pad contact hole formed at the bank.

6. The electroluminescence display according to claim 1, further comprising:

a thin film transistor formed in the display area of the substrate;

an anode electrode formed in the display area on the planarization layer; and an emission layer on the anode electrode and the bank in the display area.

7. An electroluminescence display comprising:

a substrate;

an inorganic layer on the substrate;

a first organic layer on the inorganic layer;

a first trench formed at the first organic layer;

a connection pattern covering the first trench on the first organic layer;

a second organic layer on the first organic layer and the connection pattern;

a second trench formed at the second organic layer and exposing the connection pattern;

a first contact hole exposing a first portion of the connection pattern at one side of the second trench at the second organic layer;

a second contact hole exposing a second portion of the connection pattern at another side of the second trench at the second organic layer; and a cathode electrode connected to the first portion of the connection pattern via the first contact hole, and to the second portion of the connection pattern via the second contact hole, so as to be disconnected at the second trench.

8. The electroluminescence display according to claim 7, wherein the first trench and the second trench are overlapped with each other in a vertical direction of the substrate.

9. The electroluminescence display according to claim 7, further comprising:

a common power line disposed under the first organic layer at an outside of the second portion, wherein the cathode electrode is electrically connected to the common power line.

10. The electroluminescence display according to claim 7, wherein the substrate includes a display area and a non-display area, the non-display area surrounding the display area, and wherein the first trench and the second trench are disposed in the non-display area as being closed to the display area.

11. The electroluminescence display according to claim 10, wherein the first trench and the second trench have a closed loop shape surrounding the display area, wherein the first contact hole has a closed loop shape surrounding the display area, and disposed between the display area and the first and the second trenches, and wherein the second contact hole has a closed loop shape surrounding the first and the second trenches at an outside of the first and second trenches.

12. The electroluminescence display according to claim 10, wherein the display area includes a plurality of pixels, wherein each pixel includes a driving element and a light emitting element connected to the driving element, and wherein the light emitting element includes:

an anode electrode on the first organic layer;

an emission layer on the anode electrode; and a cathode electrode on the emission layer.

13. The electroluminescence display according to claim 7, wherein the inorganic layer includes a silicon nitride material.

14. The electroluminescence display according to claim 7, wherein the inorganic layer includes a same material as a common power line disposed under the first organic layer at an outside of the second portion.

15. The electroluminescence display according to claim 14, further comprising:

a buffer layer under the inorganic layer; and a conductive layer formed on the substrate under the buffer layer, wherein the connection pattern is connected to the conductive layer.

16. An electroluminescence display comprising:

a substrate including a display area and a non-display area, the non-display area disposed around the display area;

an inorganic layer on the substrate;

a first organic layer on the inorganic layer;

a first trench formed at the first organic layer;

a connection pattern covering the first trench on the first organic layer, the connection pattern disposed between the first organic layer and a bank, and electrically connected to a common power line, wherein the connection pattern includes:

a first plane part disposed at an upper surface of the first organic layer at a first side of the first trench, a second plane part disposed at the upper surface of the first organic layer at a second side of the first trench opposite the first side of the first trench, and a connection part connecting the first plane part and the second plane part and disposed at an inner sidewall of the first trench;

a second organic layer on the first organic layer and the connection pattern;

a second trench formed at the second organic layer and exposing the connection pattern; and a cathode electrode connected to the connection pattern, wherein the bank includes:

a first contact hole exposing a portion of the first plane part; and a second contact hole exposing a portion of the second plane part, wherein the cathode electrode is connected to the first plane part via the first contact hole and to the second plane part via the second contact hole, except the connection part exposed from the first trench.

17. The electroluminescence display according to claim 16, further including:

a metal protection layer overlapping the first and second trenches under the first organic layer.

* * * * *